(12) United States Patent
Gribben

(10) Patent No.: US 11,689,165 B1
(45) Date of Patent: Jun. 27, 2023

(54) ADAPTIVE SAMPLE AND HOLD CIRCUIT FOR SIGNAL AMPLIFIER RANGE SELECTION

(71) Applicant: Dialog Semiconductor B.V., s-Hertogenbosch (NL)

(72) Inventor: Anthony Gribben, Edinburgh (GB)

(73) Assignee: Dialog Semiconductor B.V., 's-Hertogenbosch (NL)

(*) Notice: Subject to any disclaimer, the term of this patent is extended or adjusted under 35 U.S.C. 154(b) by 11 days.

(21) Appl. No.: 17/562,991

(22) Filed: Dec. 27, 2021

(51) Int. Cl.
  *H03F 3/217* (2006.01)
  *H03F 3/38* (2006.01)
  *H03F 3/181* (2006.01)
  *H03F 3/187* (2006.01)

(52) U.S. Cl.
  CPC ........... *H03F 3/2173* (2013.01); *H03F 3/187* (2013.01); *H03F 2200/03* (2013.01)

(58) Field of Classification Search
  CPC ..... H03F 3/2173; H03F 3/187; H03F 2200/03
  USPC ........................................ 330/251, 10, 207 A
  See application file for complete search history.

(56) References Cited

U.S. PATENT DOCUMENTS

| | | | |
|---|---|---|---|
| 7,227,408 B2 * | 6/2007 | Candy | H03F 3/217 330/10 |
| 7,965,138 B2 | 6/2011 | Teplechuk | |
| 8,164,382 B2 | 4/2012 | Teplechuk | |
| 8,643,436 B2 | 2/2014 | Ni et al. | |
| 8,890,608 B2 * | 11/2014 | Sahandiesfanjani | H03F 3/2175 330/10 |
| 9,444,419 B2 | 9/2016 | Petersen | |
| 9,515,617 B2 | 12/2016 | Hoyerby | |
| 9,793,867 B2 | 10/2017 | Frith et al. | |
| 10,284,155 B2 | 5/2019 | Hoyerby | |

OTHER PUBLICATIONS

ISSCC 2011 / Session 13 / Analog Techniques/ 13.3, "Filterless integrated Class-D Audio Amplifier Achieving 0.0012% THD+N and 96dB PSRR When Supplying 1.2W," by Mykhylo Teplechuk et al., 2011 IEEE International Solid-State Circuits Conference, Feb. 20-24, 2011, 3 pages.

ESS Technology, The ES8018 Sabre® Smart Power Amplifier—ESS, Copyright © 2019 ESS Technology, https://www.esstech.com > ES8018_SPA_briet_V2PDF, 3 pages.

"True Filterless Class-D Audio Amplifier," by Mykhaylo A. Teplechuk et al., IEEE Journal of Solid-State Circuits, vol. 46, No. 12, Dec. 2011, pp. 2784-2793.

(Continued)

*Primary Examiner* — Hieu P Nguyen
(74) *Attorney, Agent, or Firm* — Saile Ackerman LLC; Stephen B. Ackerman

(57) ABSTRACT

An adaptive sample and hold circuit for signal amplifier range selection is presented. The adaptive sample and hold circuit has an input for receiving an input signal and an output for providing a sample-and-hold-voltage. It also includes a sample-and-hold-capacitor to generate the sample-and-hold-voltage from the input signal, and a range detector. The range detector is adapted to identify a range of the input signal and to adjust a voltage at the sample-and-hold-capacitor based on the range of the input signal to maintain the sample-and-hold-voltage within a predetermined voltage span.

19 Claims, 14 Drawing Sheets

(56) References Cited

OTHER PUBLICATIONS

Tracking Multilevel Power Supplies for Class-D Audio Amplifiers, by Nicolai J. Dahl et al., IEEE Journal of Emerging and Selected Topics in Power Electronics, vol. 9, No. 1 Feb. 2021, pp. 156-166.
"Embedded Single-inductor Bipolar-Output DC-DC Converter in Class-D Amplifier for Low Common Noise," by Shin-Hao Chen et al., IEEE Transactions on Power Electronics, vol. 31, No. 4, Apr. 2016, pp. 3106-3117.
Co-pending US Patent, DS21-011G, A Signal Amplifier, U.S. Appl. No. 17/514,286, filed Oct. 29, 2021, by Anthony Gribben, 31 pages.

\* cited by examiner

| H-Bridge Supplies | | |
|---|---|---|
| VHbdg3 ————————————— | | |
| | Range 3 | H-Bridge output is switching between VHbdg2 and VHbdg3, Out_p higher |
| VHbdg2 ————————————— | | |
| | Range 2 | H-Bridge output is switching between VHbdg1 and VHbdg2, Out_p higher |
| VHbdg1 ————————————— | | |
| | Range 1 | H-Bridge output is switching between Ground and VHbdg1, Out_p higher |
| Ground ————————————— | | |
| VHbdg3 ————————————— | | |
| | Range 3' | H-Bridge output is switching between VHbdg2 and VHbdg3, Out_m higher |
| VHbdg2 ————————————— | | |
| | Range 2' | H-Bridge output is switching between VHbdg1 and VHbdg2, Out_m higher |
| VHbdg1 ————————————— | | |
| | Range 1' | H-Bridge output is switching between Ground and VHbdg1, Out_m higher |
| Ground ————————————— | | |

FIG. 4: H-Bridge Supply Ranges
(3 amplitudes, 2 polarities example)

FIG. 4

ADAPTIVE SAMPLE AND HOLD CIRCUIT FOR SIGNAL AMPLIFIER RANGE SELECTION

RELATED PATENT APPLICATIONS

This application is related to application no. U.S. Ser. No. 17/514,280, filed on Oct. 29, 2021 (ref: DS21-011G), assigned to a common assignee, and which are incorporated by reference in their entirety.

TECHNICAL FIELD

The present disclosure relates to an adaptive sample and hold circuit for signal amplifier range selection. In particular, the disclosure relates to an adaptive sample and hold circuit for selecting ranges of a multi-level class D amplifier.

BACKGROUND

Multi-level Class D Amplifiers are emerging as the preferred option for audio applications, due to their good efficiency, small footprint and reduced electromagnetic interference (EMI). Various topologies have been reported in US patent documents U.S. Pat. Nos. 8,643,436, 10,284, 155, 9,793,867 and scientific publications including Chen, "Embedded Single-Inductor Bipolar-Output DC-DC Converter in Class-D Amplifier for Low Common Noise", IEEE, 2016; Dahl et al, "Tracking Multilevel Power Supplies for Class-D Audio Amplifiers", IEEE 2021; and ESS Technology, "The ES8018 SABRE Smart Power Amplifier" 2019.

In many instances, a switched-capacitor structure is used to either multiply or divide a supply voltage. As the audio output signal crosses a supply step, the next supply level has to be selected. Modulation takes place within a loop to provide a H-Bridge circuit with appropriate control levels to switch between upper and lower supply voltages. At the point where the H-Bridge steps from one range to the next, there is a requirement for a step change in modulation level i.e. maximum modulation in one level to minimum level in the next as the audio signal rises. This needs to be carried out in a seamless manner without disturbing the loop. Previous publications propose introducing a sample and hold in the loop between the loop filter and the modulator in order to suppress residual switching clock signals in the loop, see for instance U.S. Pat. No. 8,164,382B2, U.S. Pat. No. 7,965, 138B2, "Filterless Integrated Class-D Audio Amplifier Achieving 0.0012% THD+N and 96 dB PSRR when Supplying 1.2 W", Mykhaylo Teplechuk, et al, ISSCC 2011 Analog Techniques 13.3; "True Filterless Class-D Audio Amplifier", Mykhaylo A. Teplechuk, et al, IEEE JSSC Vol 46, No. 12, December 2011.

In a multi-range H-Bridge, the modulation needs to step change at the point at which the H-Bridge supplies are changed. In conventional circuits, this is handled by the modulator, which increases the design complexity and decreases the efficiency of the circuit.

SUMMARY

It is an object of the disclosure to address one or more of the above mentioned limitations.

According to a first aspect of the disclosure, there is provided an adaptive sample and hold circuit comprising an input for receiving an input signal; an output for providing a sample-and-hold-voltage; a sample-and-hold-capacitor to generate the sample-and-hold-voltage from the input signal; and a range detector adapted to identify a range of the input signal and to adjust a voltage at the sample-and-hold-capacitor based on the range of the input signal to maintain the sample-and-hold-voltage within a predetermined voltage span.

Optionally, wherein the adaptive sample and hold circuit is operable in a first phase and a second phase, wherein the sample-and-hold capacitor has a first terminal for receiving the input signal and a second terminal connectable to a plurality of voltages, the range detector being adapted to switch a voltage at the second terminal so that in the first phase the second terminal is coupled to a first phase voltage and in the second phase the second terminal coupled to a second phase voltage associated with the range of the input signal.

For instance the first phase may be a sampling phase and the second phase may be a holding phase.

Optionally, the range detector comprises a plurality of comparators, each comparator being adapted to compare the input signal with a reference value.

Optionally, the input signal is a differential signal comprising a first signal and a second signal, the adaptive sample and hold circuit comprising a first sample and hold circuit for receiving the first signal and a second sample and hold circuit for receiving the second signal.

Optionally, wherein the first sample and hold circuit comprises a first sample-and-hold capacitor connectable to a plurality of voltages and wherein the second sample and hold circuit comprises a second sample-and-hold capacitor connectable to a plurality of voltages.

Optionally, the range detector comprises a differential to single ended signal converter.

Optionally, the range detector is configured to control the first and the second sample and hold circuits such that, in the second phase upon identifying that the input signal increases from a first range to a second range, the second terminal of the first sample-and-hold capacitor is coupled to a lower voltage, and the second terminal of the second sample-and-hold capacitor is coupled to a higher voltage.

Optionally, the adaptive sample and hold circuit further comprises a third sample and hold circuit comprising a third sample-and-hold capacitor having a first terminal for receiving the first signal and a second terminal connectable to a plurality of voltages; and a fourth sample and hold circuit comprising a fourth sample-and-hold capacitor having a first terminal for receiving the second signal and a second terminal connectable to a plurality of voltages.

Optionally, wherein the first sample and hold circuit and the third sample and hold circuit are operable alternately so that when one circuit is in the first phase the other one is in the second phase and vice versa; and wherein the second sample and hold circuit and the fourth sample and hold circuit are operable alternately so that when one circuit is in the first phase the other one is in the second phase and vice versa.

Optionally, wherein each sample and hold circuit comprises a first phase switch for coupling the second terminal of the sample-and-hold capacitor to the first phase voltage and a plurality of second phase switches for coupling the second terminal of the sample and hold capacitor to a plurality of pre-defined second phase voltages.

Optionally, wherein the sample and hold capacitor comprises a plurality of capacitors, each capacitor being connectable to either a ground voltage or a rail voltage.

Optionally, each capacitor among the plurality of capacitors has a first terminal for receiving input signal and a second terminal coupled to a first switch for connecting to the ground voltage and a second switching for connecting to the rail voltage.

Optionally, the first sample-and-hold capacitor comprises a plurality of capacitors, each capacitor being connectable to either a ground voltage or a rail voltage; and wherein the second sample-and-hold capacitor comprises a plurality of capacitors, each capacitor being connectable to either a ground voltage or a rail voltage.

According to a second aspect of the disclosure, there is provided a signal amplifier for amplifying an input signal, the signal amplifier comprising an adaptive sample and hold circuit comprising an input for receiving an input signal; an output for providing a sample-and-hold-voltage; a sample-and-hold-capacitor to generate the sample-and-hold-voltage from the input signal; and a range detector adapted to identify a range of the input signal and to adjust a voltage at the sample-and-hold-capacitor based on the range of the input signal to maintain the sample-and-hold-voltage within a predetermined voltage span.

Optionally, the signal amplifier further comprises a power converter coupled to a H-bridge circuit; the H-bridge circuit having a pair of output terminals for providing an output modulated voltage to a load; and a modulator circuit adapted to generate a logic signal to control the H-bridge circuit, by comparing the input signal with a waveform signal.

Optionally, the modulator comprises a wave generator adapted to provide the waveform signal; wherein the waveform signal varies between a first predetermined voltage and a second predetermined voltage.

Optionally, the first predetermined voltage and the second predetermined voltage define the predetermined voltage span.

Optionally, the signal amplifier is a multi-level class D amplifier.

The signal amplifier according to the second aspect of the disclosure may comprise any of the features described above in relation to the adaptive sample and hold circuit according to the first aspect of the disclosure.

According to a third aspect of the disclosure there is provided a method of sampling and holding a signal adaptively, the method comprising
receiving an input signal;
providing a sample-and-hold-capacitor to generate a sample-and-hold-voltage from the input signal;
identifying a range of the input signal and
adjusting a voltage at the sample-and-hold-capacitor based on the range of the input signal to maintain the sample-and-hold-voltage within a predetermined voltage span.

The third aspect may share features of the first and second aspects, as noted above and herein.

BRIEF DESCRIPTION OF THE DRAWINGS

The disclosure is described in further detail below by way of example and with reference to the accompanying drawings, in which:

FIG. 4 is a diagram illustrating six voltage ranges of the H-bridge used in the signal amplifier of FIG. 3;

DESCRIPTION

Figure 1:
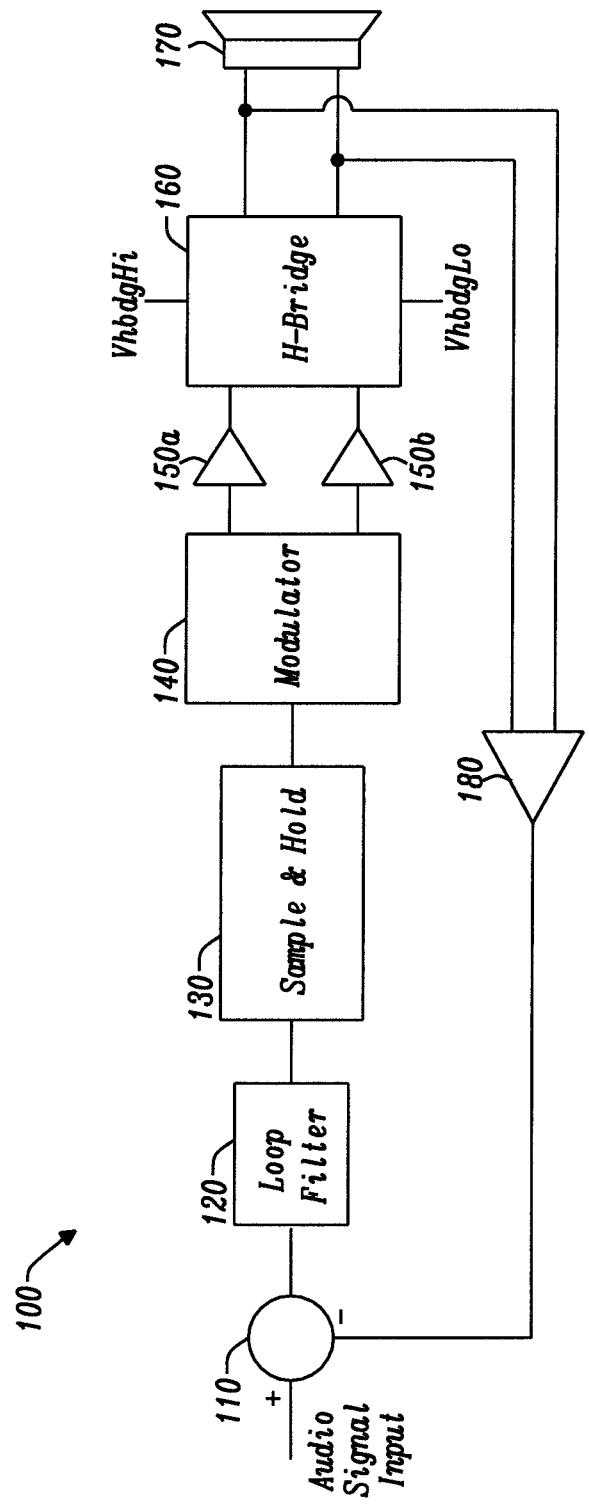
FIG. 1 is a diagram of a conventional class D audio amplifier.

FIG. 1 illustrates a conventional class D audio amplifier. The audio amplifier 100 includes a subtractor 110, a low pass filter 120, a sample and hold circuit 130, a signal modulator 140, a pair of high side and low side drivers 150a, 150b, a H-bridge circuit 160, a transducer such as a speaker 170 and a feedback circuit or feedback component 180 arranged in a feedback loop. The feedback circuit 180 provides a feedback signal that is a representation of the output signal. For instance the feedback circuit 180 may be an amplifier a resistor or an analog-to-digital ADC circuit.

In operation, the subtractor 110 receives an audio input signal from an audio source (not shown) and a feedback signal from the feedback circuit 180. The subtractor 110 subtracts the audio input signal from the feedback signal to generate an error signal. The error signal is then passed to the filter 120 for filtering out the residual high frequency component of the signal. The filtered signal passes through the sample and hold circuit 130 and is then modulated to a higher frequency using the modulator 140. The modulated signal is then used by the high side and low side drivers to operate the H-bridge circuit. The H-bridge circuit 160 switches the polarity of the voltage applied to the speaker 170 following the modulated signal, hence generating an amplified audio signal. The positive and negative terminals of the H-bridge are switched at high frequency. Some of the high frequency switching transients are reduced but not eliminated by the low pass filter. The sample and hold circuit operates at the switching frequency or a multiple, thereby providing complete attenuation at the switching frequency. The gain of the signal amplifier is determined by the ratio of the feedback to the input. The H-Bridge circuit 160 switches differential outputs at high frequency with a duty cycle proportional to the required output. Negative feedback ensures the accuracy of the output and helps eliminate inaccuracies in the forward path and H-Bridge supplies.

Figure 2:
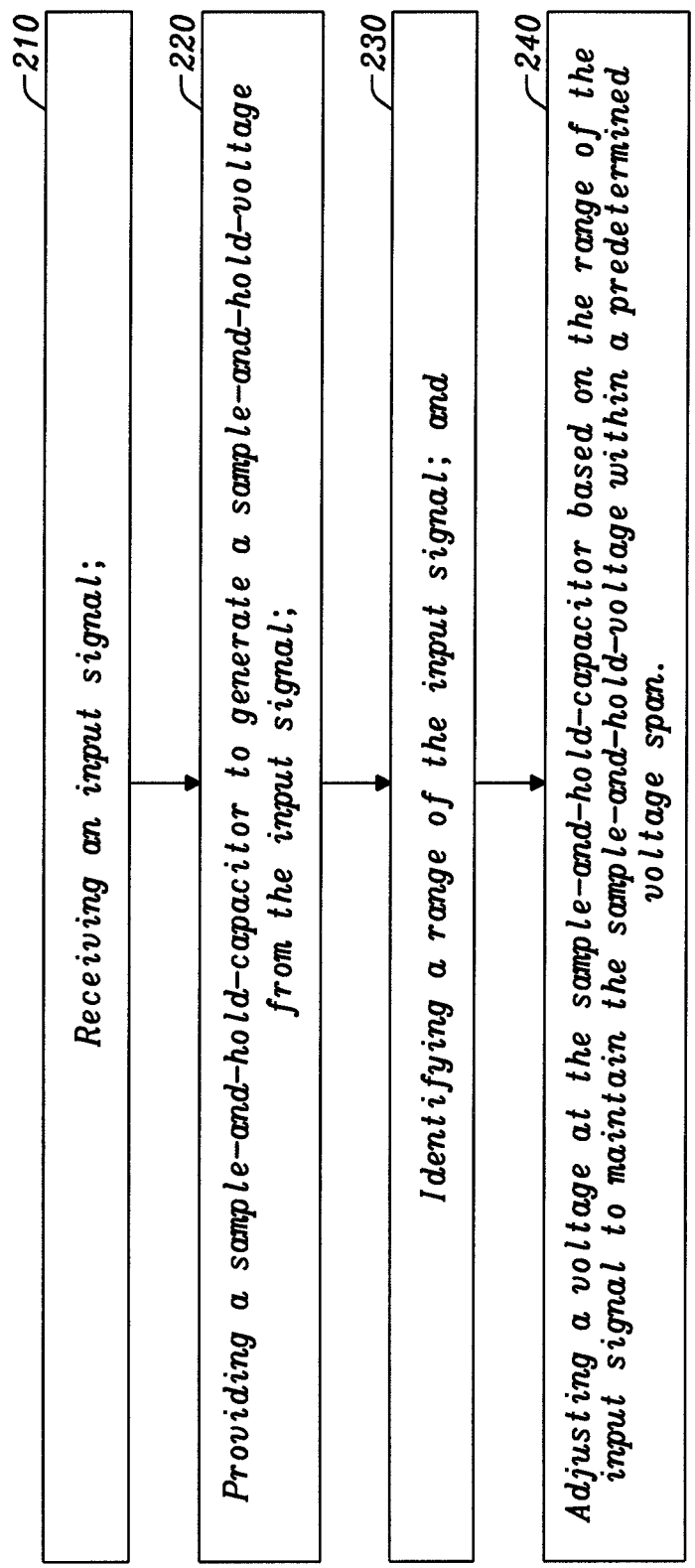
FIG. 2 is a flow chart of a method for sampling and holding a signal adaptively according to the disclosure.

FIG. 2 is a flow chart of a method for sampling and holding a signal adaptively. At step 210 an input signal is received. For instance the input signal may vary across a plurality of ranges. At step 220 a sample-and-hold-capacitor is provided to generate a sample-and-hold-voltage from the input signal. At step 230 a range of the input signal is identified. For instance the input signal may be in a first voltage range or a second voltage range or a third voltage range. At step 240 a voltage at the sample-and-hold-capacitor is adjusted based on the range of the input signal to maintain the sample-and-hold-voltage within a predetermined voltage span.

For instance the voltage may be a backgate voltage applied to the sample and hold capacitor during the holding phase. The backgate voltage may be increased when the input signal goes down from a higher range to a lower range. Similarly the backgate voltage may be decreased when the input signal goes up from a lower range to a higher range.

For instance the sample-and-hold capacitor may have a first terminal for receiving the input signal and a second terminal connectable to a plurality of voltages.

A range detector may be provided to switch a voltage at the second terminal so that in a first (sampling) phase the second terminal is coupled to a first phase voltage and in a second (holding) phase the second terminal is coupled to a second phase voltage associated with the range of the input signal.

For instance three or more pre-defined second phase voltages may be provided, each second phase voltage being associated with a specific voltage range.

Figure 3:
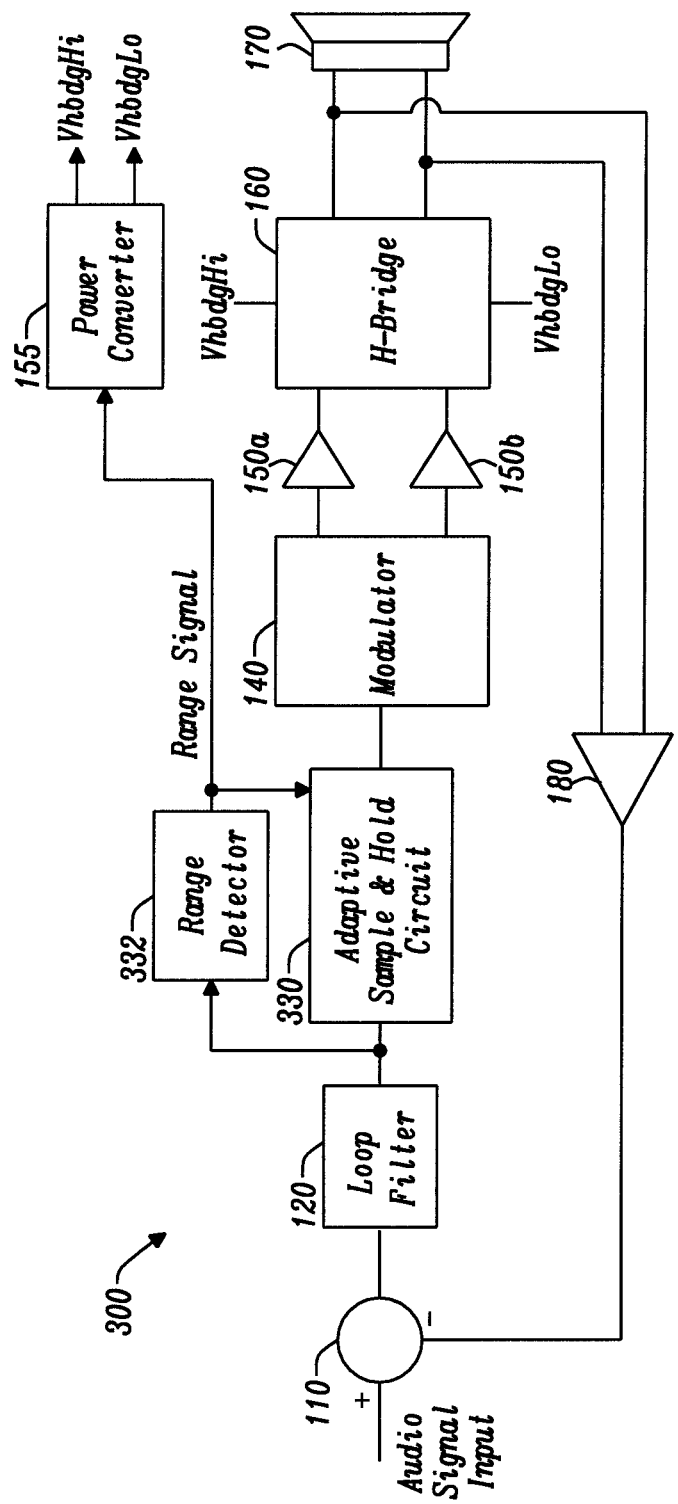
FIG. 3 is a diagram of a signal amplifier according to the disclosure.

FIG. 3 is a diagram of a signal amplifier circuit according to the disclosure. The circuit 300 is similar to the circuit 100 described in FIG. 1, however in this case the conventional sample and hold circuit 130 has been replaced by an adaptive sample and hold circuit 330 coupled to range detector 332 is also provided. The range detector circuit 332 is configured to provide a control signal, also referred to as range signal to control the operation of the S&H circuit 330, and to control the voltage range across the H-bridge circuit 160. For instance the range signal may control voltages provided by a power converter 155, such as a buck or a boost or a buck-boost converter.

In a multi-level Class D loop, the H-Bridge supplies VhbdgHi and VhbdgLo are stepped with the voltage range of the incoming signal. It is therefore required to determine the voltage range and modulate the H-Bridge signal inputs accordingly.

FIG. 4 is a diagram illustrating six voltage ranges of the H-bridge used in the signal amplifier of FIG. 3. Although six ranges are represented it will be appreciated that the technique can be applied to any number of ranges. The voltage range is selected based on the output of the loop filter 120. In this example, the assumption is that the differential outputs of the loop filter 120 can each swing between 0 and vdd.

For each polarity three ranges are available. For polarity p the differential output out_p is higher than the differential out_m and the ranges are labelled range 1, range 2 and range 3. For polarity m the differential output out_m is higher than out_p and the ranges are labelled range 1', range 2' and range 3'.

For the first polarity (polarity p), in Range 1 the H-Bridge output out_p is switching between ground and VHbdg1, and out_m is grounded. In Range 2 the H-Bridge output out_p is switching between VHbdg1 and VHbdg2 and out_m is grounded. In Range 3 the H-Bridge output is switching between VHbdg2 and VHbdg3 and out_m is grounded. Similarly the polarity m, in Range 1' the H-Bridge output out_m is switching between ground and VHbdg1, and out_p is grounded. In Range 2' the H-Bridge output out_m is switching between VHbdg1 and VHbdg2 and out_p is grounded. In Range 3' the H-Bridge output out_m is switching between VHbdg2 and VHbdg3 and out_p is grounded.

Figure 5:
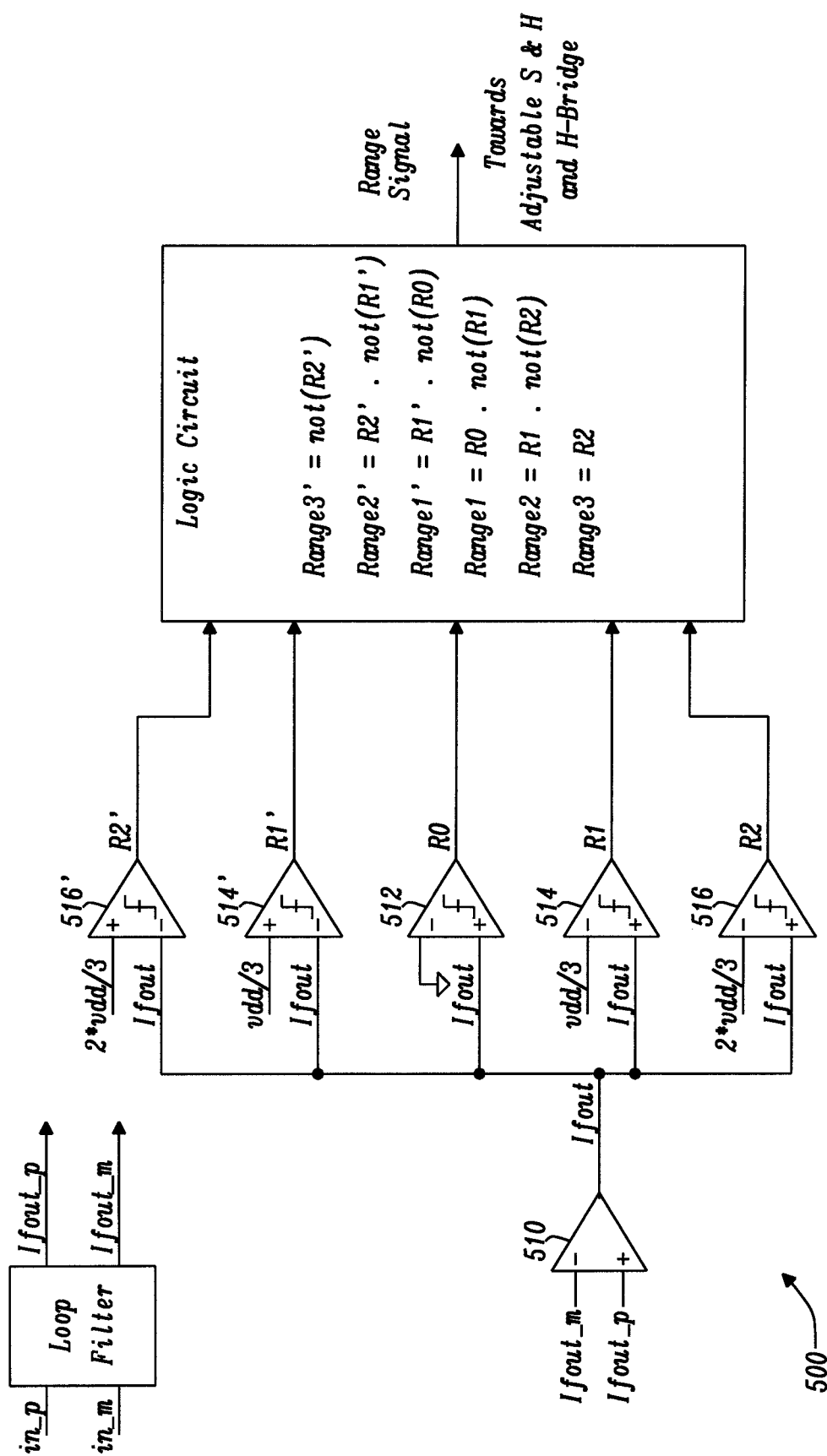
FIG. 5 is an example embodiment of a range detector.

FIG. 5 is an example embodiment of a range detector. The range detector 500 includes a differential amplifier 510, five comparators 512, 514, 516, 514', 516' and a logic circuit 518.

In operation the differential amplifier 510 converts the differential signal from the loop filter (positive signal lfout_p and negative signal lfout_m) into a single-ended signal lfout.

The signal lfout is then compared with different reference levels. For 3 positive ranges range 1, range 2, range 3 and 3 negative ranges range 1' range 2' and range 3', the reference levels may be set at thirds of the signal range. In this example the comparator 512 compares lfout with ground and provides a comparison signal R0. The comparator 514 compares lfout with Vdd/3 and provides a comparison signal R1. The comparator 516 compares lfout with 2Vdd/3 and provides a comparison signal R2. Similarly the comparator 514' compares lfout with Vdd/3 and provides a comparison signal R1' (in this case the Vdd/3 is provided at the non-inverting input). The comparator 516' compares lfout with 2Vdd/3 and provides a comparison signal R2' (in this case the 2Vdd/3 is provided at the non-inverting input).

The comparison signals R0, R1, R2, R1' and R2' may be thermometer codes which are then decoded and compared by the logic circuit 518 to determine the range. For instance if R0 is high and R1 is low, the range is range 1 and the range signal is range 1, if R2 is low and R1 is high, then the range signal is range 2 etc. . . . . The logic circuit 518 may be implemented using various logic gates arrangements to perform these operations. The logic circuit 518 then provides the range signal to the adaptive sample and hold circuit and to the H-bridge, for instance as a multibit signal.

Figure 6A:
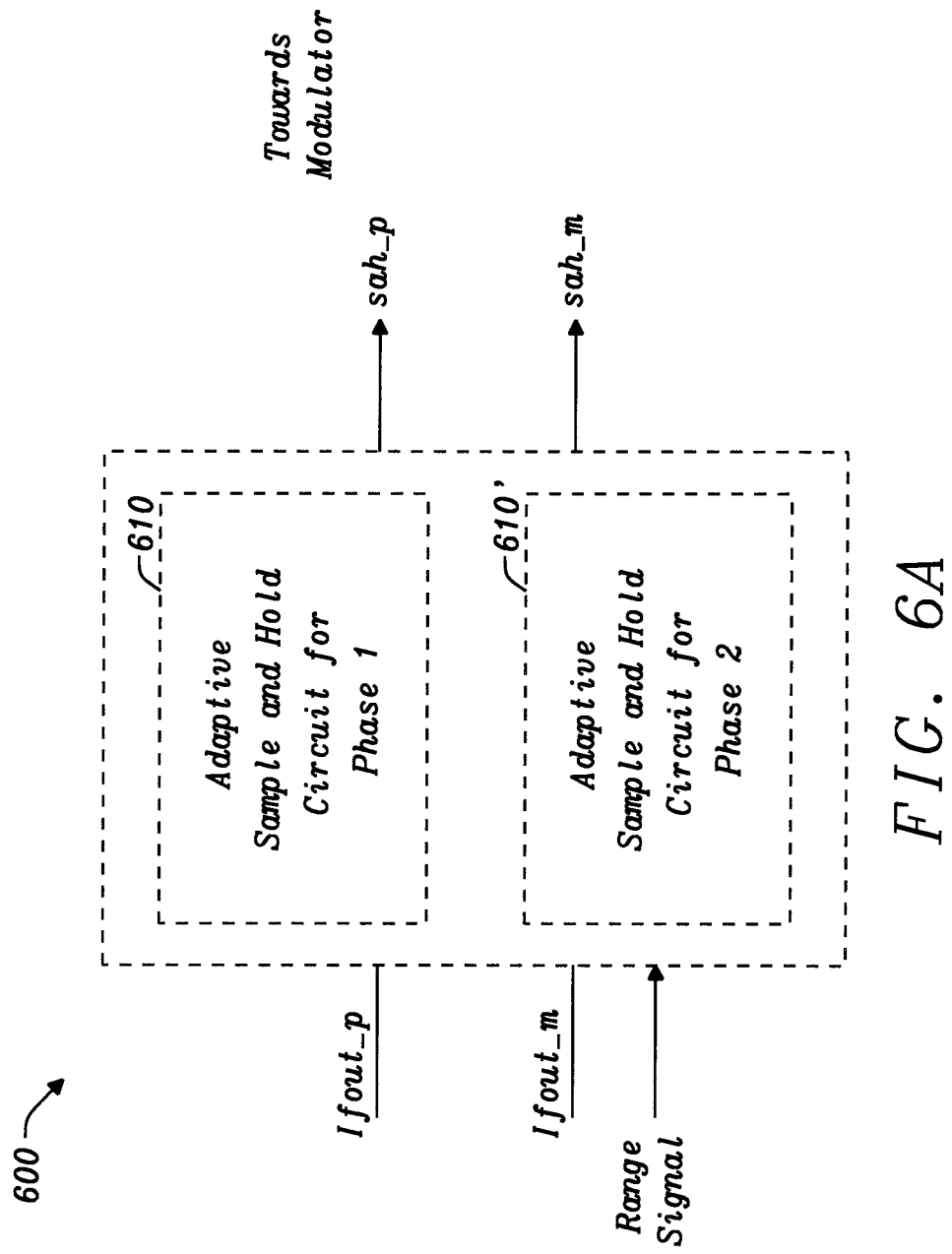
FIG. 6A is a diagram of an adaptive sample-and-hold circuit.

FIG. 6A is a diagram of an adaptive sample-and-hold circuit. The adaptive sample-and-hold circuit 600 includes a first circuit 610 a second circuit 610'. The outputs of the first and second circuits 610 and 610' are coupled to the modulator.

Figure 6B:
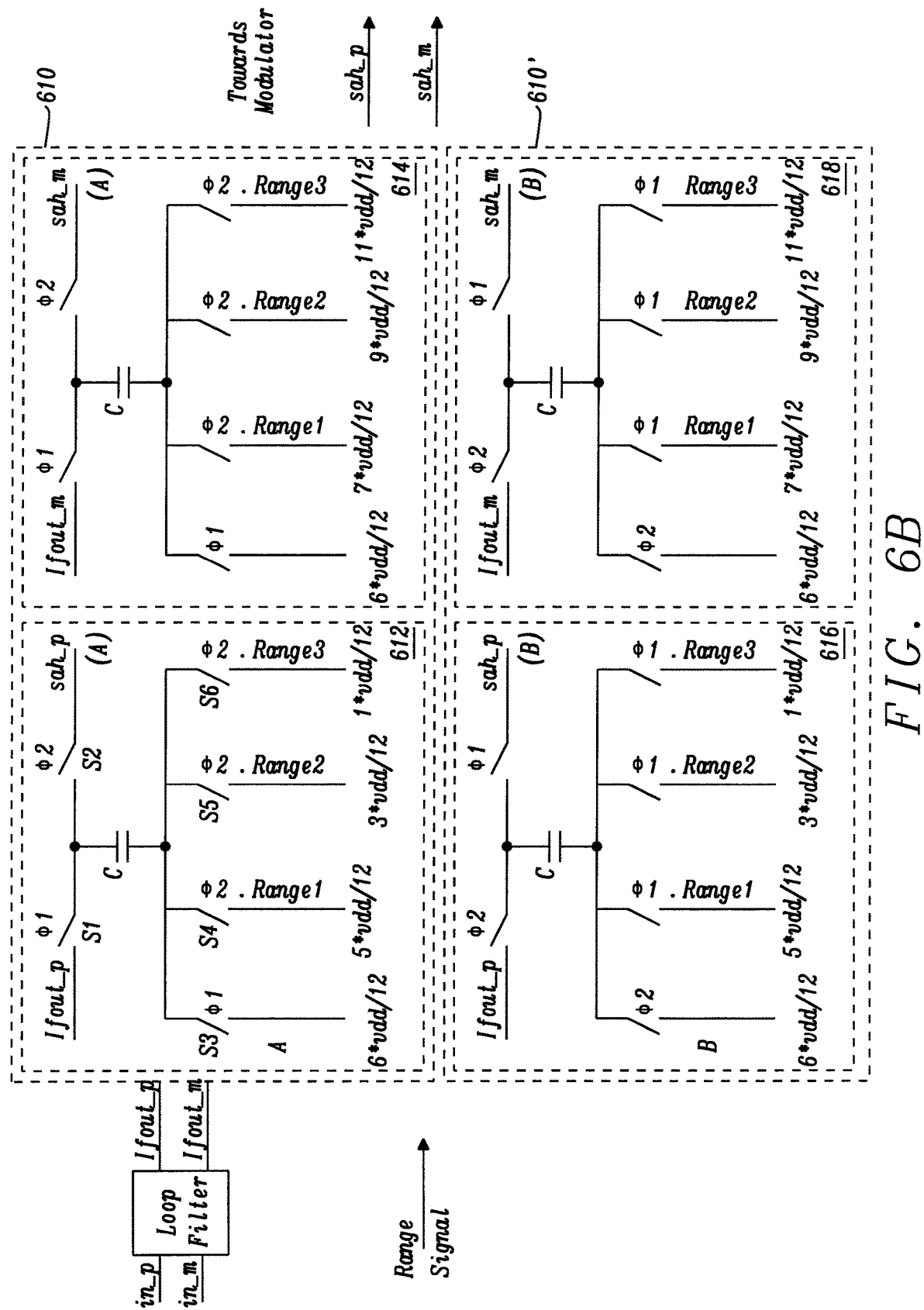
FIG. 6B is an example embodiment of the adaptive sample-and-hold circuit of FIG. 6A for 3 positive ranges.

FIG. 6B is an example embodiment of the adaptive sample-and-hold circuit 600 for positive voltages. The adaptive sample-and-hold circuit 610 includes four sub sample and hold circuits 612, 614, 616, 618.

Each sub sample and hold circuit includes a capacitor C and six switches S1-S6. The capacitor C has a first terminal for receiving one of the differential output lfout_p or lfout_m of the loop filter and a second terminal, also referred to as backgate, connectable to a plurality of voltage levels.

The sub sample and hold circuits 612 provides a signal sah_p(A). The sub sample and hold circuits 614 provides a signal sah_m(A). The sub sample and hold circuits 616 provides a signal sah_p(B). The sub sample and hold circuits 618 provides a signal sah_m(B).

The circuits 616 and 618 are provided to perform so called ping pong operation enable a continuous output. The circuits 612 and 616 operate alternatively so that when one circuit is sampling the other one is holding and vice versa. The two circuits use opposite clock phases, that is out of phase and non-overlapping (apart from a small dead time). One circuit samples during φ1 and outputs during φ2, while the other circuit samples during φ2 and outputs during φ1. There is no conflict as each circuit drives the output at different times. Similarly the circuits 614 and 618 operate alternatively so that when one circuit is sampling the other one is holding and vice versa. Effectively the adaptive sample and hold circuit is operating at twice the clock rate.

The sub-circuits 616 and 618 are optional. In other implementations these sub circuits may be replaced by a buffer to permit continuous operation.

To maintain a consistent signal range in the modulator, the voltage range is adjusted by switching the backgate of the capacitors present in the adaptive sample and hold circuit.

Figure 6C:
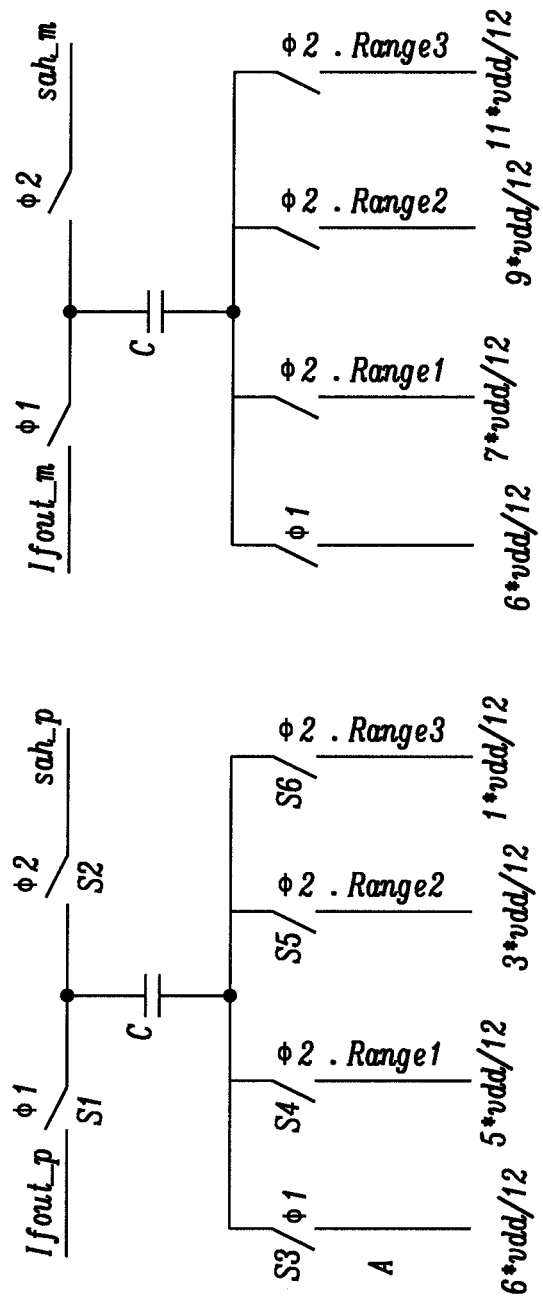
FIG. 6C is a diagram illustrating the operation of two sub sample and hold circuits of FIG. 6B.

FIG. 6C is a diagram illustrating the operation of two sub sample and hold circuits 612 and 614 of FIG. 6B.

Each subcircuit operates in a sample phase Φ1 and a holding phase Φ2 (two sample and holds in opposite phase on lfout_p and two in opposite phase on lfout_m). In the sample phase Φ1 the switches S1 and S3 are on (closed) and the remaining switches S2, S4, S5 and S6 are off (open). The second terminal of the capacitor is connected to the first-phase voltage (in this example 6Vdd/12, the common mode level). In the holding phase Φ2, the switches S1 and S3 are off (open). The switch S2 and one of the switches S4-S6 are on (closed) depending on which range is selected. For Range 1, Range 2, and Range 3 corresponding to a first polarity of the differential signal (see lfout_m and lfout_p before t5) three second-phase voltages are provided 5Vdd/12, 3 Vdd/12 and 1Vdd/12 for circuit 612, and 7Vdd/12, 9Vdd/12 and 11Vdd/12 for circuit 614.

For Range 1', Range 2' and Range 3' corresponding to the opposite polarity of the differential signal (See FIG. 9 after time t5), the voltages would be reversed as follows. In Range1' in the second phase (circuits 612) the capacitor backgate is switched to 7Vdd/12, slightly lifting the S&H p output, while the backgate on the m side (circuit 614) is driven to 5Vdd/12, lowering the S&H m output by Vdd/12. Then in Range2' in the second phase the p capacitor backgate is switched to 9Vdd/12 (circuit 612) and the m capacitor backgate (circuit 614) is switched to 3Vdd/12. Similarly, in Range 3', in circuit 612 the cap backgate is switches to 11Vdd/12, while in circuit 614 the capacitor backgate is switched to Vdd/12. Therefore the voltages are changed over time depending on the polarity of the differential signal.

The voltage levels may be created by a low power voltage reference circuit, for instance a resistive or a capacitive divider from Vdd. The selected levels may be buffered and used for the sample and hold S&H backgate. The mid-level voltage 6Vdd/12 is commonly available for general analogue signal processing.

In operation, the loop filter outputs lfout_p and lfout_m, are sampled on phase φ1, relative to half range (the common mode voltage). During the phase φ2, the output is passed to the modulator, but the output range is adjusted by switching the voltage on the backgate of the sample and hold depending on the range being used.

The backgate of the capacitor is switched to keep the sample and hold output voltages in a same range, in this example between 5Vdd/12 to 7Vdd/12. For higher input voltages, >7Vdd/12, the second phase backgate voltage needs to be reduced to reduce the output voltage of the Sample and Hold. As the input signal gets larger, the second-phase voltage is reduced for the circuits 612 and 616 delivering the signal sah_p, and the second-phase voltage is increased for the circuits 614 and 618, delivering the signal sah_m. For instance, for the subcircuit 612 the voltage applied to the backgate of the capacitor decreases from 5Vdd/12 for range 1 to 3Vdd/12 for range 2 and to Vdd/12 for range 3. In the meantime for the subcircuit 614 the voltage applied to the backgate of the capacitor increases from 7Vdd/12 for range 1 to 9Vdd/12 for range 2 and to 11Vdd/12 for range 3.

As a result the sample and hold outputs, sah_p and sah_m, are always in a consistent range. In this example which uses 3 levels and 3 negative levels, the range is between 5*vdd/12 to 7*vdd/12.

Figure 7:
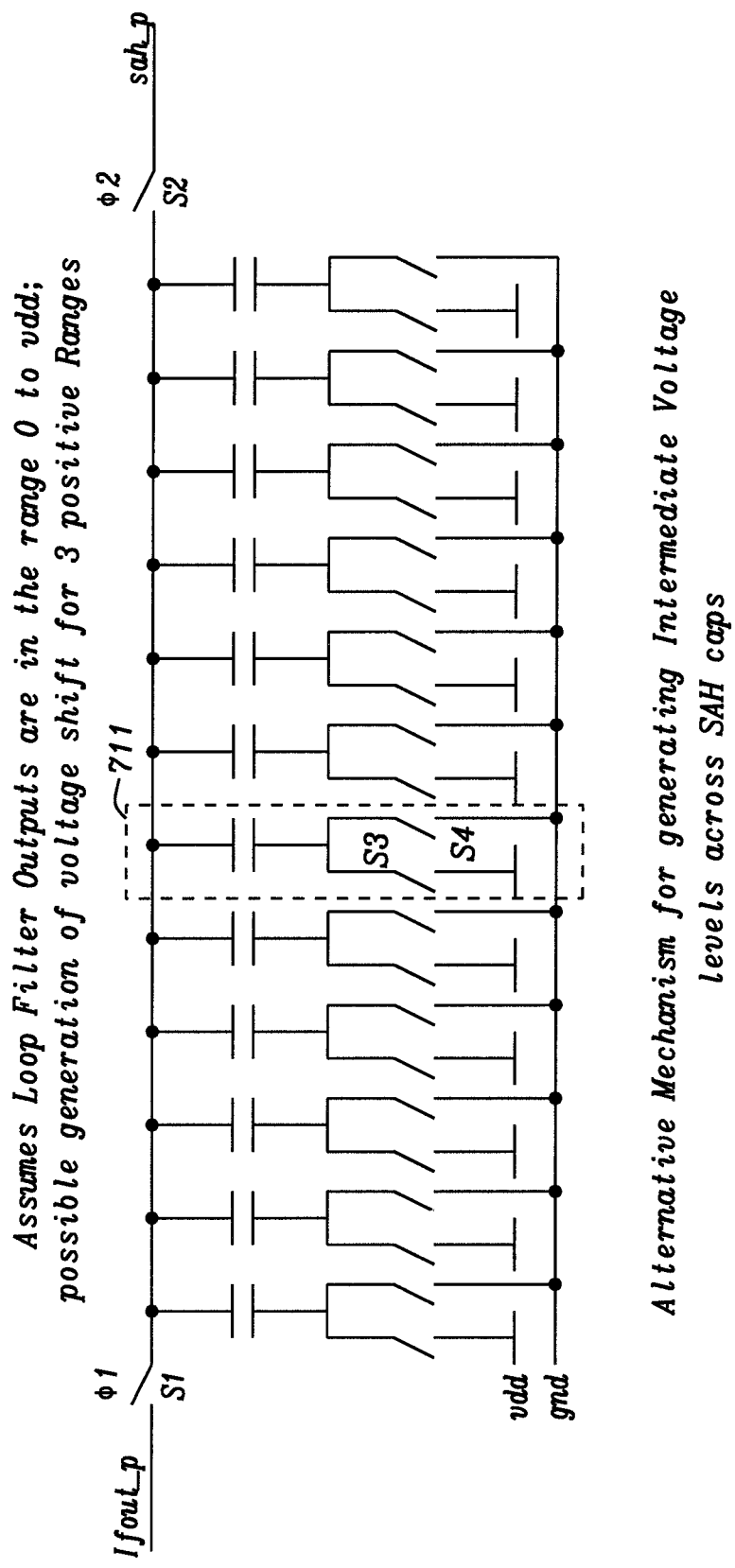
FIG. 7 is a diagram of another sample-and-hold topology.

FIG. 7 shows a diagram of a topology for generating all the intermediate backgate voltages within the sample and hold. In this case, the circuit 700 includes a plurality of cells 711. In this example 12 cells are provided. Each cell comprises a capacitor C having a first terminal for receiving one of the differential output lfout_p or lfout_m of the loop filter and a second terminal, also referred to as backgate, connectable to either a rail voltage Vdd via switches S3 or to ground (Vss) via switch S4. The operation is based on the same principle of switching the backplate voltage to adjust the voltage range out of the sample and hold.

The overall sample and hold capacitor (total capacitance) can be split and the appropriate number of sections switched to either vdd or gnd to apply the effective intermediate potential on the bottom plate of the capacitor. This is similar to the operation of a capacitive DAC. The 12 cells make N*vdd/12 by connecting N units with the back-plate to vdd and the other 12-N units with the backplate to ground (Vss). This reduces the number of intermediate voltage levels that needs to be generated (some additional voltage levels are still required for range selection) at the expense of multiple switches and the layout overhead of the split capacitor. The circuit 700 can be duplicated depending on the number of sub circuits required. For instance, the subcircuits 612, 614, 616 and 618 of FIG. 6B could be replaced by four sub circuits as described in FIG. 7.

Figure 8A:
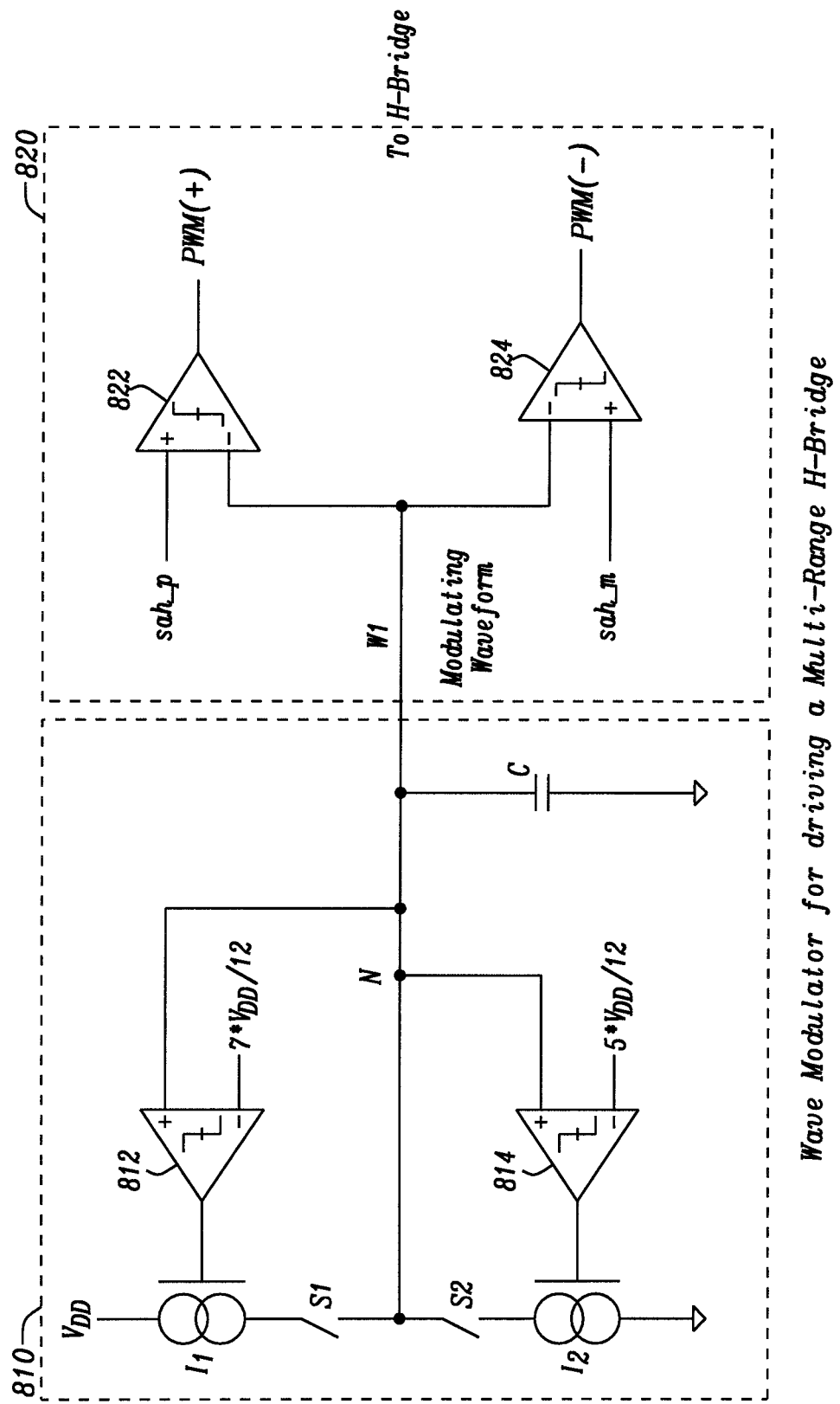
FIG. 8A is a diagram of a modulator.

FIG. 8A is a diagram illustrating a modulator 800 for generating a modulated signal PWM. The modulator 800 includes a wave generator 810 coupled to a driver 820. The wave generator 810 includes two current sources I1, I2, two switches S1, S2 and a capacitor C. The first current source I1 has a first terminal for receiving the rail voltage Vdd and a second terminal coupled to output node N via switch S1. The second current source I2 has a first terminal coupled to ground and a second terminal coupled to node N via switch S2. A pair of comparators 812, 814 is also provided to drive the current sources I1 and I2. The comparator 812 has a non-inverting input coupled to node N and an inverting input receiving a first voltage, in this example $7V_{DD}/12$. The comparator 814 has a non-inverting input coupled to node N and an inverting input receiving a second voltage, in this example $5V_{DD}/12$. The output of the comparator 812 is coupled to the first current source I1. Similarly the output of the comparator 814 is coupled to the second current source I2.

The capacitor C has a first terminal coupled to the output node N and a second terminal coupled to ground. The switches S1 and S2 are operated to charge and discharge the capacitor C and generate a triangular waveform W1 having an amplitude varying from 5*vdd/12 to 7*vdd/12. The current source values and the capacitor will determine the slope of the waveform W1.

The driver 820 is formed of two comparators: a first comparator 822 for providing a first driving signal PWM(+), and a second comparator 824 for providing a second driving signal PWM(−). The first comparator 822 has a first input for instance a non-inverting input for receiving the signal sah_p, and a second input for receiving the waveform W1 from the waveform generator 810. The second comparator 824 has a first input for instance an inverting input coupled to node N, and a second input for instance a non-inverting input for receiving the signal sah_m.

When the signal sah_p is greater than W1, the PWM(+) signal is high (logic 1). When the signal sah_p is lower than W1, the PWM(+) signal is low (logic 0). Similarly when the signal sah_m is greater than W1, the PWM1(−) signal is high (logic 1). When the signal sah_m is lower than W1, the PWM1(−) signal is low (logic 0).

Figure 8B:
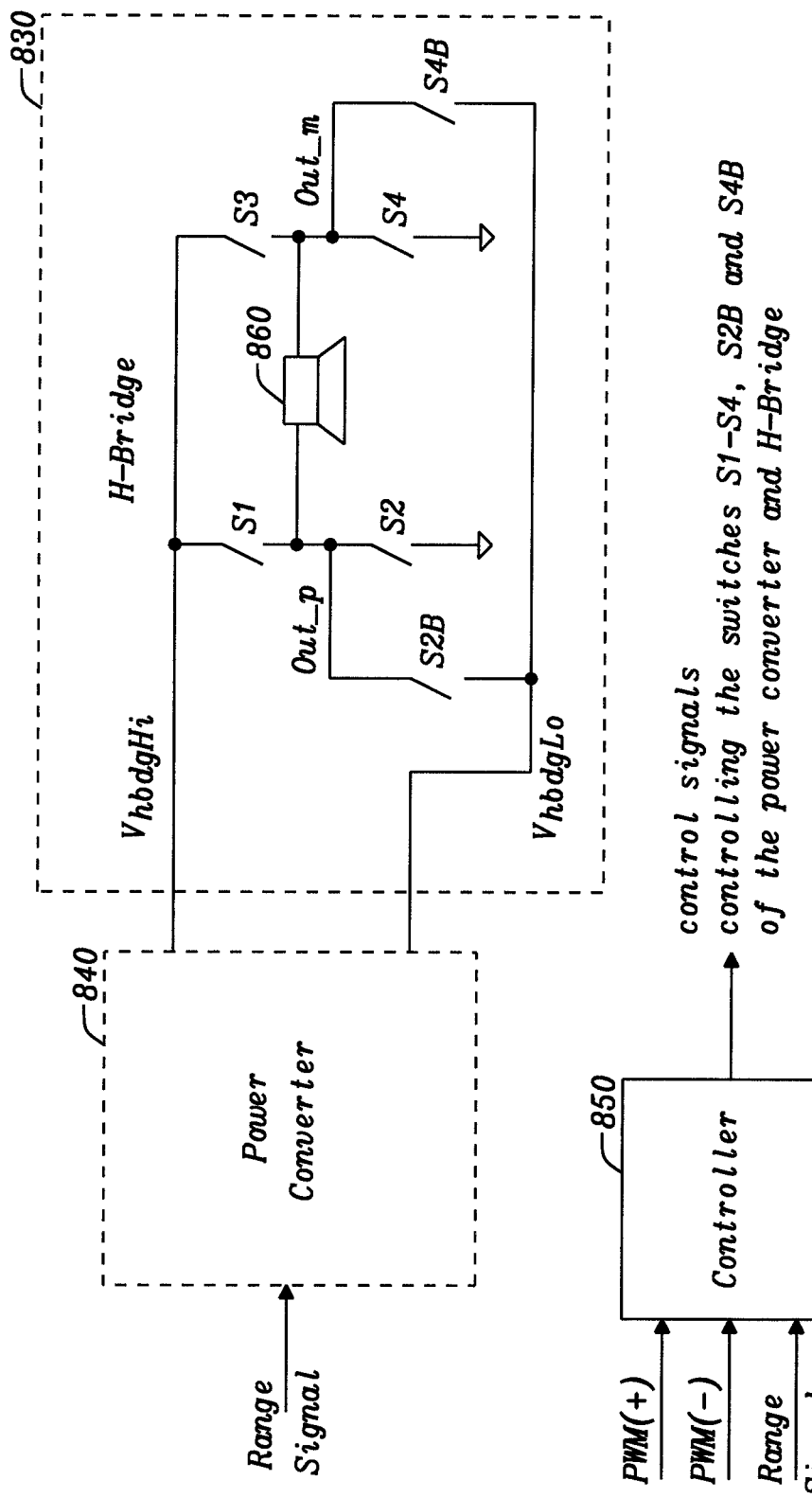
FIG. 8B is a diagram of a H-bridge circuit coupled to a power converter.

FIG. 8B is a schematic diagram of a H-bridge circuit 830 coupled to a power converter 840. The power converter 840 receives the range signal from the range detector to provide the voltages VhbdgLo and VhbdgHi. A controller 850 is provided to control the H-bridge circuit 830. The controller 850 receives the range signal, the signals PWM(+) and PWM(−), and provides a plurality of signals to control the switches S1-S4, S2B and S4B of the H-bridge.

For a switched-capacitor Boost/Buck converter which generate multiples/sub-multiples of the supply, intermediate output voltages could be obtained by alternately switching between different levels and filtering. In this case, this technique could be applied to the modulation scheme.

Figure 9:
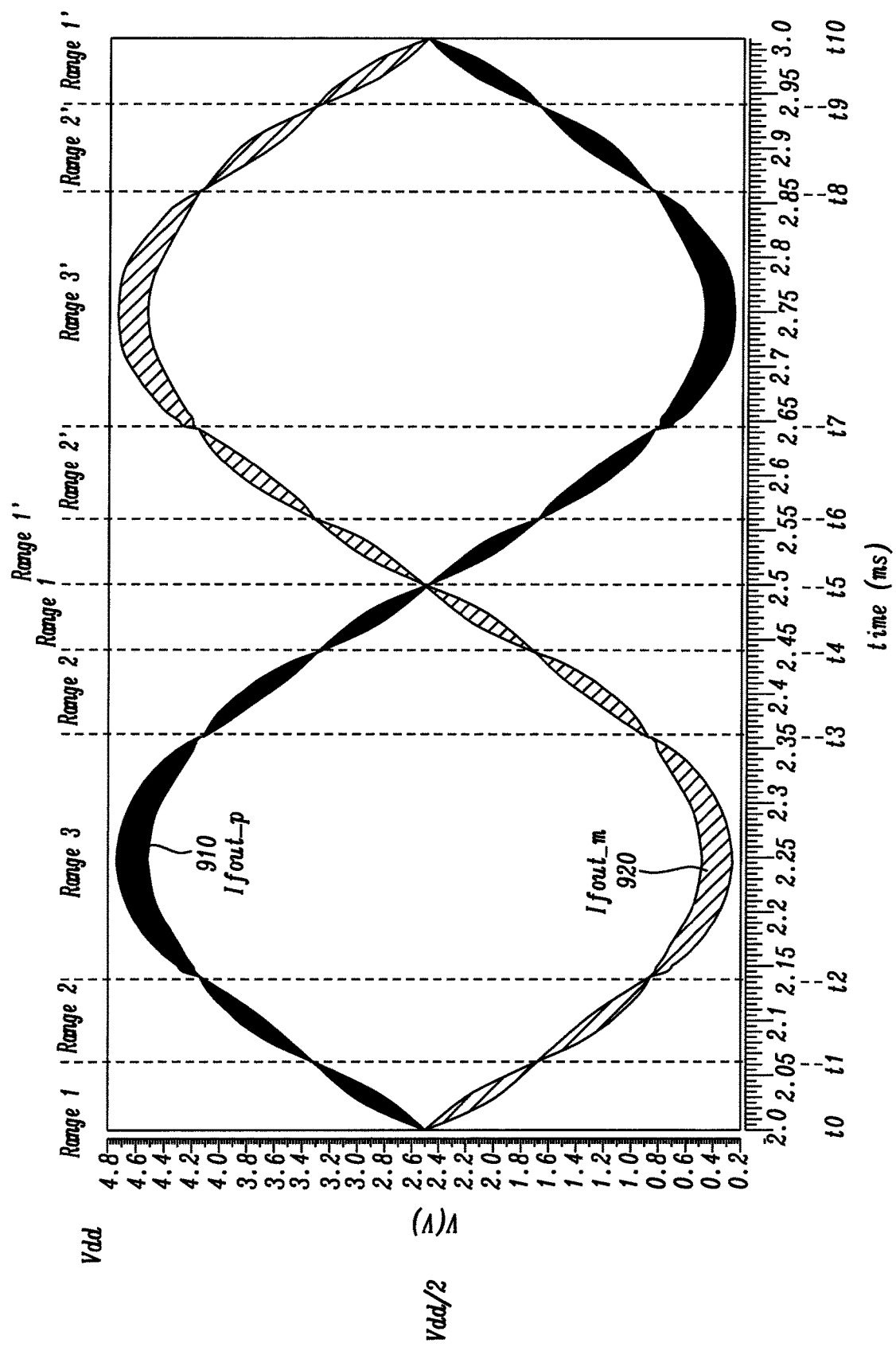
FIG. 9 is a simulation of two loop filter output signals.

FIG. 9 is a simulation of the loop filter output signals lfout_p and lfout_m. The simulation is provided for the complete loop, consequently the residual switching after the loop filter can be seen in the simulation result. The waveform 910 shows the output signal lfout_p and the waveform 920 shows the output lfout_m. The simulation is for a Class D Amplifier driving a 1 kHz sine wave. The loop filter output signal lfout_p has a positive half-period between the times t0 and t5 and a negative half-period between the times t5 to t10. In the positive half period the filter output signal lfout_p evolves between three positive ranges Range1, Range2 and Range3. The signal lfout_p is in range 1 between the times t0 and t1, in range 2 between the times t1 and t2, in range 3 between the times t2 and t3, in Range2 between the times t3 and t4, in Range1 between the times t4 and t5. In the negative half period the filter output signal lfout_p evolves between three negative ranges Range1', Range2' and Range3' in a similar manner, in which Range1'=−Range1, Range2'=−Range2, Range3'=−Range3. The H-Bridge supplies for Range1' are the same as for Range1 except that the out_m is driven and out_p is held at ground. Similarly the H-Bridge supplies for Range2' are the same as for Range2, etc. . . . .

Similarly, the loop filter output signal lfout_m has a negative half-period between the times t0 and t5 evolving between Range1', Range2' and Range3' and a positive half-period between the times t5 to t10 evolving between Range1, Range2 and Range3.

Figure 10:
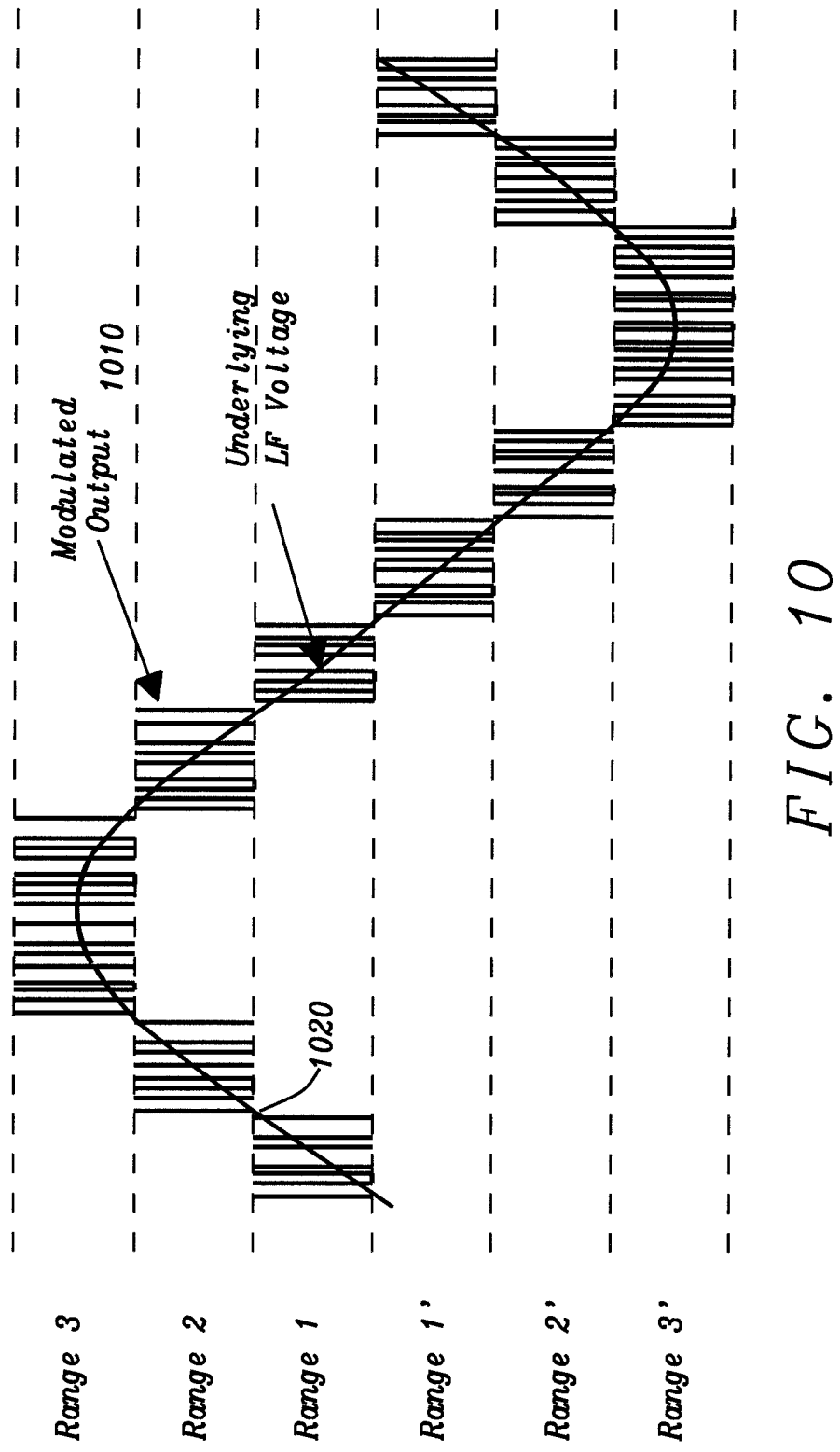
FIG. 10 is a waveform diagram showing the multi-level modulated output voltage generated at the output terminals of a H-bridge.

FIG. 10 is a waveform diagram showing the multi-level modulated output voltage 1010 generated at the output terminals of the H-bridge and the corresponding average output voltage Vout 1020 applied to the speaker. In this example six ranges (Range1, Range2, Range3, Range1', Range2' and Range3') are used. In each range the modulation duty cycle increases from 0 up to 100%. Multi-level modulated output voltages can be used to improve efficiency and minimise EMI radiation by reducing the amplitude of the switched steps. Multi-level modulated signals can be generated using capacitive multiplication to generate integer multiples of the supply voltage. Alternatively a divider producing integer sub-multiples could be used. Inductive techniques may also be envisaged.

Figure 11:
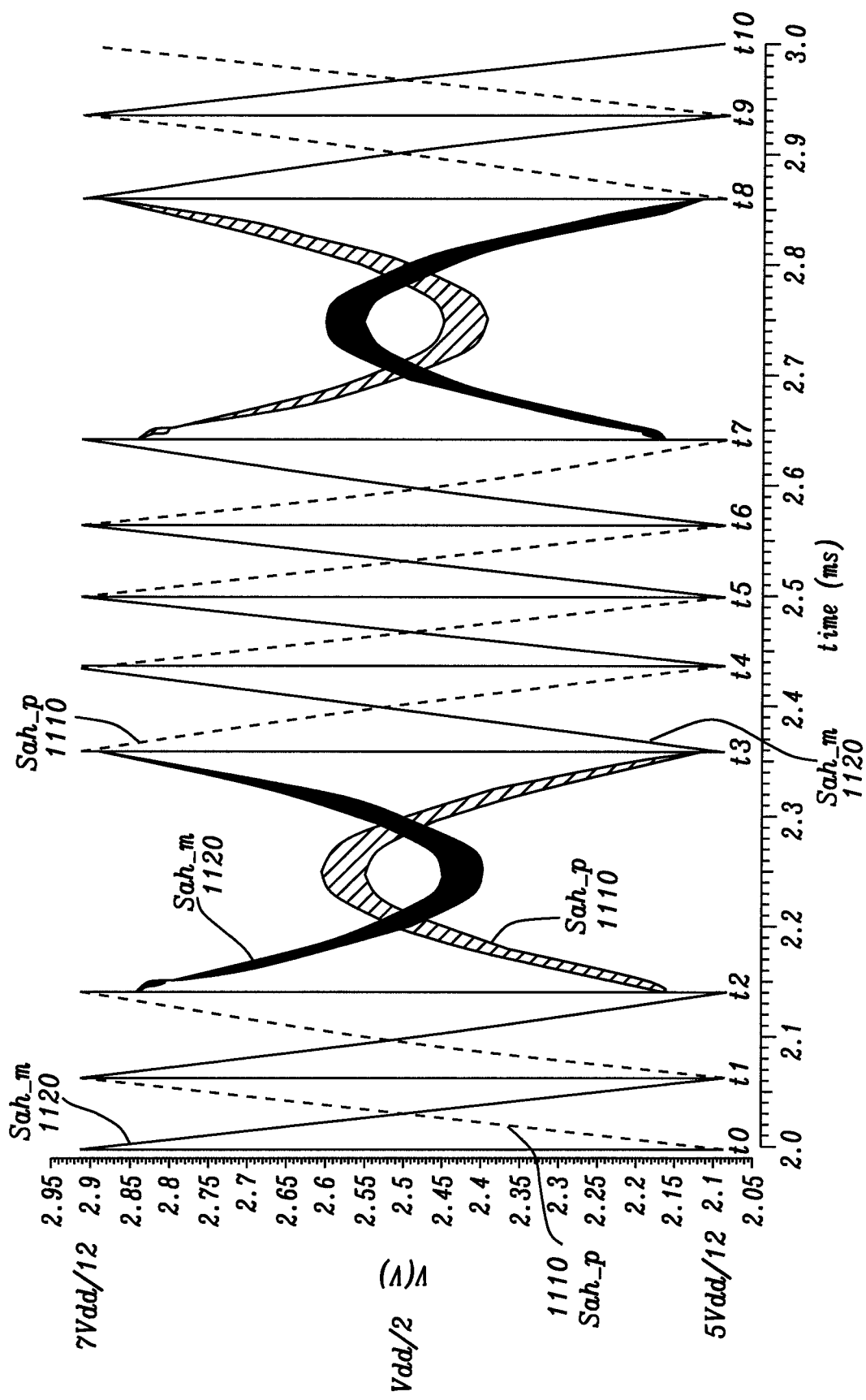
FIG. 11 is a simulation of the sample and hold outputs of the adaptive sample and hold circuit.

FIG. 11 is a simulation of the sample and hold outputs sah_p and sah_m after adjusting for range. The waveform 1110 shows the sample and hold signal Sah_p and the waveform 1120 shows the sample and hold signal Sah_m. The simulation was obtained for Vdd=5V.

Between the times t0 and t1 the signal sah_p 1110 increases from 5Vdd/12 up to 7Vdd/12 while the signal sah_m 1120 decreases from 7Vdd/12 to 5Vdd/12.

At time t1, it is detected that another range has been reached and the voltage switched onto the backplate of the sample and hold caps changes. As a result, the sample and hold outputs, sah_p and sah_m, swap and when fed to the modulator, the modulation level goes from 100% to 0%. The next range change occurs at time t2.

Between the times t1 and t2 the signal sah_p 1110 increases from 5Vdd/12 up to 7Vdd/12 while the signal sah_m 1120 decreases from 7Vdd/12 to 5Vdd/12. At time t2 the signals are swapped as a result of the capacitor backgate voltages being changed as Range 3 is entered.

Between the times t2 and t3 the signal sah_p 1110 increases from 5Vdd/12 above Vdd/2 and decreases back to 5Vdd/12, while the signal sah_m 1120 decreases from 7Vdd/12 to below Vdd/2 and increases back to 7Vdd/12.

At time t3 the signals are swapped as a result of the range change and the voltages being switched onto the backplates of the sample and hold capacitors being changed. Between the times t3 and t4 the signal sah_p 1110 decreases from 7Vdd/12 down to 5Vdd/12 while the signal sah_m 1120 increases from 5Vdd/12 up to 5Vdd/12. At time t4 the signals are swapped again etc. . . . .

There are various advantages to switching the backgate voltage of the sample and hold capacitor. Firstly, the loop filter, which has the slowest response in the loop, runs continuously so it does not see any disturbance in its signal flow as the range changes. Secondly it provides an instant—within ns and well within a clock period—step in the ranged signal. Thirdly, the modulator only has to run over the same restricted range (in this example between 5*vdd/12 to 7*vdd/12) for all ranges. As a result, the correct modulation is achieved for the new supply ranges without delay.

The proposed technique can be applied in a ping-pong manner. As described above this can be achieved using a second sample and hold circuit operating in antiphase from the first one, so that their outputs are complementary, and the modulator input (m or p) is continuously driven.

The technique of the disclosure is extendable to multiple ranges and can be implemented when the Class D output is boosted or divided. The modulator may also be adapted to perform secondary modulation as described in (U.S. Ser. No. 17/514,280).

A skilled person will therefore appreciate that variations of the disclosed arrangements are possible without departing from the disclosure. Accordingly, the above description of the specific embodiments is made by way of example only and not for the purposes of limitation. It will be clear to the skilled person that minor modifications may be made without significant changes to the operation described.

What is claimed is:

1. An adaptive sample and hold circuit comprising
an input for receiving an input signal;
an output for providing a sample-and-hold-voltage;
a sample-and-hold-capacitor to generate the sample-and-hold-voltage from the input signal; and
a range detector adapted to identify a range of the input signal and to adjust a voltage at the sample-and-hold-capacitor based on the range of the input signal to maintain the sample-and-hold-voltage within a predetermined voltage span.

2. The adaptive sample and hold circuit as claimed in claim 1, wherein the adaptive sample and hold circuit is operable in a first phase and a second phase,
wherein the sample-and-hold capacitor has a first terminal for receiving the input signal and a second terminal connectable to a plurality of voltages,
the range detector being adapted to switch a voltage at the second terminal so that in the first phase the second terminal is coupled to a first phase voltage and in the second phase the second terminal is coupled to a second phase voltage associated with the range of the input signal.

3. The adaptive sample and hold circuit as claimed in claim 1, wherein the range detector comprises a plurality of comparators, each comparator being adapted to compare the input signal with a reference value.

4. The adaptive sample and hold circuit as claimed in claim 2, wherein the input signal is a differential signal comprising a first signal and a second signal, the adaptive sample and hold circuit comprising a first sample and hold circuit for receiving the first signal and a second sample and hold circuit for receiving the second signal.

5. The adaptive sample and hold circuit as claimed in claim 4, wherein the first sample and hold circuit comprises a first sample-and-hold capacitor connectable to a plurality of voltages and wherein the second sample and hold circuit comprises a second sample-and-hold capacitor connectable to a plurality of voltages.

6. The adaptive sample and hold circuit as claimed in claim 3, wherein the range detector comprises a differential to single ended signal converter.

7. The adaptive sample and hold circuit as claimed in claim 5, wherein the range detector is configured to control the first and the second sample and hold circuits such that, in the second phase
upon identifying that the input signal increases from a first range to a second range, the second terminal of the first sample-and-hold capacitor is coupled to a lower voltage, and the second terminal of the second sample-and-hold capacitor is coupled to a higher voltage.

8. The adaptive sample and hold circuit as claimed in claim 4, wherein the circuit comprises a third sample and hold circuit comprising a third sample-and-hold capacitor having a first terminal for receiving the first signal and a second terminal connectable to a plurality of voltages; and a fourth sample and hold circuit comprising a fourth sample-and-hold capacitor having a first terminal for receiving the second signal and a second terminal connectable to a plurality of voltages.

9. The adaptive sample and hold circuit as claimed in claim 6,
wherein the first sample and hold circuit and the third sample and hold circuit are operable alternately so that when one circuit is in the first phase the other one is in the second phase and vice versa; and
wherein the second sample and hold circuit and the fourth sample and hold circuit are operable alternately so that when one circuit is in the first phase the other one is in the second phase and vice versa.

10. The adaptive sample and hold circuit as claimed in claim 5, wherein each sample and hold circuit comprises a first phase switch for coupling the second terminal of the sample-and-hold capacitor to the first phase voltage and a plurality of second phase switches for coupling the second terminal of the sample and hold capacitor to a plurality of pre-defined second phase voltages.

11. The adaptive sample and hold circuit as claimed in claim 1, wherein the sample and hold capacitor comprises a plurality of capacitors, each capacitor being connectable to either a ground voltage or a rail voltage.

12. The adaptive sample and hold circuit as claimed in claim 11, wherein each capacitor among the plurality of capacitors has a first terminal for receiving input signal and a second terminal coupled to a first switch for connecting to the ground voltage and a second switching for connecting to the rail voltage.

13. The adaptive sample and hold circuit as claimed in claim 5, wherein the first sample-and-hold capacitor comprises a plurality of capacitors, each capacitor being connectable to either a ground voltage or a rail voltage; and wherein the second sample-and-hold capacitor comprises a plurality of capacitors, each capacitor being connectable to either a ground voltage or a rail voltage.

14. A signal amplifier for amplifying an input signal, the signal amplifier comprising
an adaptive sample and hold circuit comprising an input for receiving an input signal; an output for providing a sample-and-hold-voltage; a sample-and-hold-capacitor to generate the sample-and-hold-voltage from the input signal; and a range detector adapted to identify a range of the input signal and to adjust a voltage at the sample-and-hold-capacitor based on the range of the input signal to maintain the sample-and-hold-voltage within a predetermined voltage span.

15. The signal amplifier as claimed in claim 14, further comprising
a power converter coupled to a H-bridge circuit; the H-bridge circuit having a pair of output terminals for providing an output modulated voltage to a load; and
a modulator circuit adapted to generate a logic signal to control the H-bridge circuit, by comparing the input signal with a waveform signal.

16. The signal amplifier as claimed in claim 15, wherein the modulator comprises a wave generator adapted to provide the waveform signal; wherein the waveform signal varies between a first predetermined voltage and a second predetermined voltage.

17. The signal amplifier as claimed in claim 16, wherein the first predetermined voltage and the second predetermined voltage define the predetermined voltage span.

18. The signal amplifier as claimed in claim 14, wherein the signal amplifier is a multi-level class D amplifier.

19. A method of sampling and holding a signal adaptively, the method comprising
receiving an input signal;
providing a sample-and-hold-capacitor to generate a sample-and-hold-voltage from the input signal;
identifying a range of the input signal and
adjusting a voltage at the sample-and-hold-capacitor based on the range of the input signal to maintain the sample-and-hold-voltage within a predetermined voltage span.

* * * * *